United States Patent [19]

Grabbe

[11] Patent Number: 5,019,892
[45] Date of Patent: May 28, 1991

[54] CHIP CARRIER WITH ACCUMULATOR

[75] Inventor: Dimitry G. Grabbe, Middletown, Pa.

[73] Assignee: AMP Incorporated, Harrisburg, Pa.

[21] Appl. No.: 158,014

[22] Filed: Feb. 18, 1988

[51] Int. Cl.[5] ............................................ H01L 23/02
[52] U.S. Cl. ........................................ 357/74; 357/72
[58] Field of Search ................................ 357/72, 74, 80

[56] References Cited

U.S. PATENT DOCUMENTS

| 4,079,511 | 3/1978 | Grabbe | 29/627 |
| 4,147,889 | 4/1979 | Andrews | 174/52 |
| 4,339,768 | 7/1982 | Keller | 357/72 |
| 4,410,905 | 10/1983 | Grabbe | 357/80 |
| 4,426,769 | 1/1984 | Grabbe | 29/588 |

FOREIGN PATENT DOCUMENTS 62-160746 7/1987 Japan .

OTHER PUBLICATIONS

Document Entitled "A Premolded Chip Carrier W/Compliant Leads" by D. Grabbe of AMP Incorporated 1977.
AMP Document P217-79 Entitled "Automated Packaging of a Premolded Chipcarrier" by Grabbe, Keizer, 1979.
AMP Document Entitled "Premolded Integrated Circuit Packaging Technology" by D. Grabbe.

Primary Examiner—Andrew J. James
Assistant Examiner—Courtney A. Bowers
Attorney, Agent, or Firm—Bruce J. Wolstoncroft

[57] ABSTRACT

A chip carrier (2) for use with an integrated circuit chip (4) has an accumulator means (38) provided in an enclosed gel filled chip receiving opening (14). The accumulator means (38) and the gel (34) cooperate to fill the opening (14), such that as the gel (34) expands, the accumulator means (38) is forced to contract. This cooperation insures that the forces applied to the chip carrier (2) due to the expansion of the gel (34) will not be great enough to cause the failure of the chip carrier (2). In the alternative, as the gel (34) contracts, the accumulator means (38) expands, insuring that a constant pressure is applied to the gel (34), thereby preventing the unrestrained motion of the gel (34) in the chip receiving opening (14). Consequently, the accumulator means (38) and the gel (34) cooperate to insure that the chip carrier (2) and the chip (4) therein will be reliable in any type of environment.

4 Claims, 1 Drawing Sheet

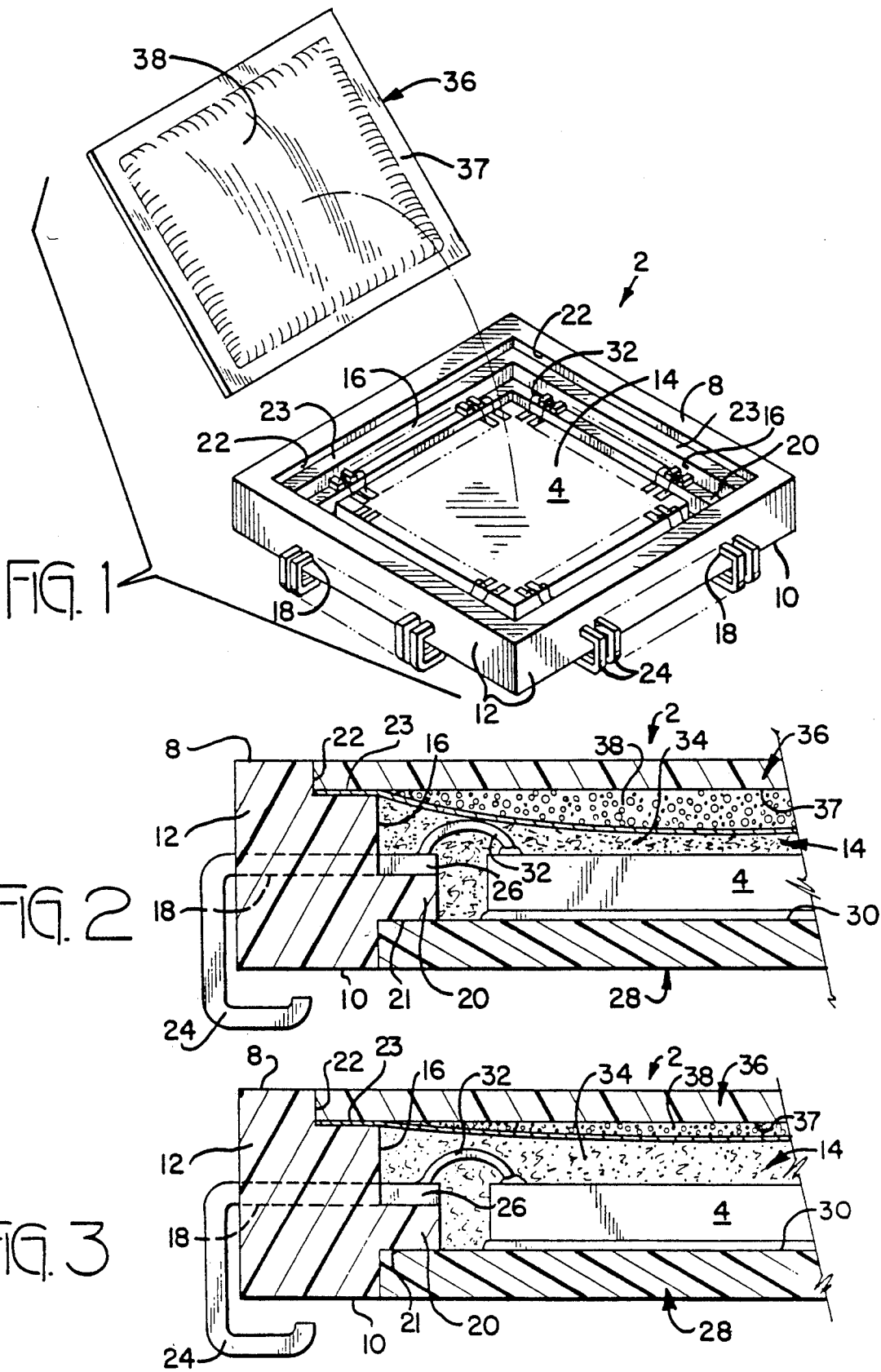

CHIP CARRIER WITH ACCUMULATOR

FIELD OF THE INVENTION

The invention is directed to a chip carrier which provides a reliable electrical connection in hostile environments. In particular, the chip carrier is provided with an accumulator means in the chip receiving opening to help insure the reliability of the chip carrier.

BACKGROUND OF THE INVENTION

A wide variety of chip carriers are known in the industry. Many of these chip carriers have unique features which insure that the chips positioned in the chip carriers will perform in various environments.

One type of chip carrier, which attempts to solve problems of environmental exposure, is described in U.S. Pat. No. 4,079,511. This patent discloses a hermetically sealed chip carrier which prevents moisture from entering the recess of the chip carrier, thereby preventing moisture from reaching and damaging the chip contained therein. This particular patent is but one example of hermetically sealed chip carriers, many other hermetically sealed chip carriers are also available in the marketplace. However, these chip carriers are not designed to protect the chip under extreme conditions, such as in environments where the chip is exposed to extreme vibration, extreme lateral forces, or extreme temperature changes. Examples of such environments in which the chip and chip carrier may be exposed to these extreme conditions include; in any manufacturing facility where machines are used for processes which inherently have large vibrations associated therewith, in the oil drilling fields where large lateral forces are applied to the drill head of the equipment and where extreme temperature ranges may be reached.

If the controls for the equipment used in these extreme surroundings requires only minimal electronics, which requires the use of only small IC chips, a post molded IC package is adequate. In this type of arrangement, the chip and bonding wires are totally enclosed in plastic. The entire assembly of circuit boards and associated components is then cast into an essentially monolithic block, using 95% sand and 5% binder, as for example epoxy resin. Such a block being essentially monolithic there are no voids or spaces into which any part of the components could displace, since all volumes were solidly filled. This type of arrangement does not have problems with the mismatch of thermal coefficient of expansion, etc. due to the small package in which the electronics are contained.

However, with larger program computers requiring more highly integrated electronics, the chips are becoming large, on the order of half inch square and even larger. The larger scale of the chips highlights the problem of the thermal coefficient of expansion mismatch between the silicon and molding resin, which causes the wire bonds between the leads of the chip carrier and the conductive pads of the chip to fracture. The problem is magnified in the types environments described above. When the chip are activated, the chips will expand due to the dissipation of power in them, while the surrounding material is lagging. This results in stresses and failures of the chip and bond.

It is therefore necessary to find a way of packaging the large chips which will operate properly in the various hostile environments.

SUMMARY OF THE INVENTION

The invention is directed to a chip carrier for use with an integrated circuit, which protects the chip and the interconnections associated therewith in environments in which the chip carrier is exposed to extreme conditions. The chip carrier is comprised of a housing which has a first major surface and an oppositely facing second major surface. A chip receiving opening is provided in the chip carrier and extends from the first major surface toward the second major surface. Side walls are provided about the chip receiving opening, the side walls also extend from first major surface to second major surface. The chip receiving opening has a gel provided therein, the gel surrounds the chip positioned in the chip receiving opening. A cap is positioned in the chip receiving opening proximate the first major surface, the cap cooperates with the side walls to retain the gel in the chip receiving opening. Terminals of the chip carrier extend from the chip receiving opening through the side walls.

The chip carrier is characterized in that accumulator means are provide in the chip receiving opening. The accumulator means has resilient characteristics which allow the accumulator means to compress when a force is applied thereto, and expand back to its original volume when the force is removed. Such that as the gel is caused to expand in the chip receiving opening, the accumulator means is forced to compress thereby accommodating the expanded volume of the gel, as the rest of the chip carrier is essentially nonelastic. As the process is reversed, and the gel contracts, the accumulator means expands to insure that an adequate pressure is maintained on the gel in order to prevent the unrestrained motion of the gel in the chip receiving opening.

BRIEF DESCRIPTION OF THE DRAWINGS

FIG. 1 is a perspective view of a chip carrier of the present invention, with a top plate exploded therefrom.

FIG. 2 is a cross sectional view of the chip carrier when the chip is in a nonoperative state, the chip receiving opening of the chip carrier filled with a gel.

FIG. 3 is a cross sectional view similar to that of FIG. 2, showing the chip carrier when the chip is in an operative state, with the gel expanded.

DETAILED DESCRIPTION OF THE INVENTION

Referring to FIG. 1, a chip carrier 2 is provided to enclose an integrated circuit (IC) chip, to protect a respective integrated circuit chip 4 during handling and transportation thereof. Chip carrier 2 is made of plastic or some other material having the dielectric and structural characteristics required.

Chip carrier 2 has a first major surface 8 and an oppositely facing second major surface 10. Side walls 12 extend from first surface 8 to second surface 10 to form a rectangular shaped box. A chip receiving opening 14 is provided in chip carrier 2 and extends from the first major surface 8 to second major surface 10. Opening side surfaces 16 are positioned about chip receiving opening 14.

As best shown in FIG. 2, chip carrier 2 has lead receiving openings 18 which extend in a plane which is parallel to the plane of first major surface 8. Openings 18 extend from opening side surfaces 16 through side walls 12 of chip carrier 2. As is shown in FIG. 1, lead receiving openings 18 extend from all sides of chip carrier 2.

Provided in chip receiving opening 14, directly beneath lead receiving openings 18 are projections 20 which extend from side surfaces 16 inward toward the center of opening 14. Projections 20 are positioned proximate second major surface 10 and extend about each side surface 16 of opening 14. Each projection 20 is integral with adjacent projections 20. Bottom surfaces 21 of projections 20 form a bottom shoulder, as will be discussed. Side walls 12 are provided with recesses 22 which are positioned proximate first major surface 8 of chip carrier 2. As with projections 20, recesses 22 extend about each side wall 12, with respective recesses 22 being integral with adjacent recesses 22. Surfaces 23 of recesses 22 cooperate to form a top shoulder which extends about the entire perimeter of chip receiving opening 14.

Leads 24 are positioned in lead receiving openings 18 of chip carrier 2. As shown in FIG. 2, outside ends 25 of leads 24 extend beyond side walls 12. Outside ends 25 are formed into the shape required for operation, such as for insertion in a socket or for attachment to a printed circuit board. Inside ends 26 of leads 24 extend from lead receiving openings 18 into chip receiving opening 14. Inside ends 26 of leads 24 are positioned such that projections 20 cooperate with ends 26 of leads 24 to provide ends 26 with the structural support necessary to prevent bending of ends 26. As shown in FIG. 2, ends 26 of leads extend into chip receiving opening 14 approximately the same distance as projections 20 extend into opening 14.

A base plate 28 is provided to cooperate with chip receiving opening 14. The dimensions of base plate 28 are essentially equal to the dimensions of opening 14. Base plate 28 is made of metal or some other substance having the desired heat flow characteristics.

Base plate 28 is inserted into the end of chip receiving opening 14 which is proximate second surface 10. Insertion is continued until a leading surface 30 of base plate 28 engages shoulders 21 of projections 20. Base plate 28 is maintained in this position due to the frictional engagement of base plate 28 with side surfaces 16. In the alternative, base plate 28 may be maintained in opening 14 by other well known means. With base plate 28 fully inserted into opening 14, a pocket is formed in chip carrier 2.

Chip 4 is mounted on base plate 28 by means of a silver epoxy 29 or the like. The composition of epoxy 29 and the material of base plate 28 are dependent upon the characteristics desired for enhanced performance, i.e. heat transfer properties, etc.

With base plate 28 press fit, glued, etc. in opening 14 and chip 4 mounted in position on base plate 28, conductive areas of chip 4 are electrically connected to ends 26 of leads 4. Electrically conductive wires 32 are provided, as best shown in FIGS. 2 and 3, to electrically connect the conductive areas of chip 4 with ends 26 of leads 24. In order to accomplish the electrical connection, first ends of wires 32 are physically and electrically attached to the conductive areas of chip 4 and second ends of wires 32 are physically and electrically attached to ends 26 of leads 24. This process of wire bonding is well known in the industry, and therefore, only a brief explanation will be provided. It should be noted that tape automated bonding (TAB) can also be used.

The bonds are typically made using gold wire of approximately 0.001". The two ends of the wire are attached to the chip and package respectively and the strength of the bonds varies substantially at the two ends. In a conventional wire bond, a ball is formed at the end of the gold wire by means of melting. The ball is then deformed by pressure of the capillary against the chip surface, augmented by a lateral, rapid oscillation imported through an ultrasonic generator at the base of the capillary holder. Once this bond is made, the capillary lifts, moves over to the outer bond area and the pressure of oscillation cycle is repeated, however this time there is no ball—the wire is simply punched off by the capillary. This results is a very small area of bond and a relatively weak mechanical connection.

After wires 32 have been secured in position, chip receiving opening 14 is filled with a suitable insulating and sealing material such as, for example, a silicone gel designated generally by reference number 34. This silicone gel prevents air and moisture from reaching chip 4, wires 32, etc. Dow Corning Q-3 6527 is particularly suitable for the application although many others are equally suitable. This gel, by a judicious mixing of its components, can be made to exhibit different mechanical strength, ranging from almost liquid to rubber-like. The correct strength or durometer should be such that rapid expansion of the chip when it is powered up and associated movement of the wires which are attached to the chip would not cause a force on the wires or bonds of a magnitude which could break the bonds or wires, i.e. the wires must be able to traverse through the encapsulate (gel) quite freely. Such gels, while essentially not compressible, are quite readily displaceable, therefore, one must take care of preventing any movement or slushing around of the gels inside the package when the package is subjected to shock or vibration.

After gel 34 has been applied, a cap 36 is placed on chip carrier 2. Cap 36, is inserted into recesses 22 which surround chip receiving opening 14. Cap 36 is fully inserted when a leading surface 37 of cap 36 engages shoulders 23 of recesses 22. Gluing, bonding, or press fitting insures that cap 36 is retained in position with respect to chip receiving opening 14. The mounting of cap 36 into recesses 22 of chip carrier 2 completely encloses chip receiving opening 14, as is shown in FIGS. 2 and 3.

As base plate 28 and cap 36 are stamped and formed from metal or molded plastic, neither base plate 28 nor cap 36 mates perfectly with the side walls 12 of chip receiving opening 14. In other words, tolerances of the various parts involved can cause spacing between any given side wall 12 and base plate 28 or cap 36. To accommodate such mating deficiencies cap 36 is placed into opening 14 with sufficient force to cause the gel-like sealant 34 to flow into any cracks or spaces between side walls 12 of chip receiving opening 14 and base plate 28 and/or cap 36, making the seal therebetween sufficiently perfect to prevent moisture and other atmospheric contaminants from entering into the area, thereby avoiding corrosion and failure of the chip.

Leading surface 37 of cap 36 has an accumulator 38 provided thereon. Accumulator 38 extends from leading surface 37 into chip receiving opening 14 when cap 36 is fully inserted into chip carrier 2. Various materials can be used for accumulator 38, such as for example a relatively hard rubber bladder. It is important that any material used be compressible. The particular shape of accumulator 38 can assume various configurations, as long as accumulator 38 extends into chip receiving opening 14 to cooperate with gel 34 in order to prevent the movement of gel 34 when chip carrier 2 is exposed to large lateral forces. The manner in which accumulator 38 and gel 34 cooperate will be more fully described below.

As was previously described, various chip carriers have been packaged in different ways in order to protect the chips contained therein. However, with the need for the integrated circuits to analyze more data, the size of the chips required has increased. As size of the chip and chip carrier increases, the mismatch of the various thermal coefficients of expansion becomes significant. Due to the substantial thermal coefficient of expansion mismatch between the silicon and molding resin, the problem arises of wires or wire bonds being fractured when extreme temperatures are reached, or when severe changes in temperature occur in a short time. This is the reason why so many large chip carriers are socketed instead of being directly soldered to the circuit board, as socketing avoids the rapid expansion of components during reflow soldering of the circuit board assembly. Therefore, socketing avoids the high temperature exposure of the chip carrier. However, due to the large forces encountered in the hostile environments previously described, socketing is an impractical and ineffective solution.

An example of the hostile environments referred to would include environments where the temperature can reach 60 degrees below zero. The entire chip carrier and internal components are chilled to that temperature. When activated, however, the chip due to the dissipation of power associated therewith expands, while the surrounding material is lagging, and this results in stresses and failures of the chip and bond. This same problem is present when the wire bonds are soldered to the chip.

It is therefore essential that a chip carrier be provided which allows chip 4 to be electrically connected to leads 24 by means of wire bonding. Consequently, the chip carrier of the present invention is configured to withstand the extreme temperature conditions and the large forces applied thereto.

In order to accomplish this objective, chip receiving opening 14 is filled with gel 34 prior to insertion of cap 36 into opening 14. As was previously described, gel 34, by a judicious mixing of its components, can be made to exhibit different mechanical strength. The correct strength of gel 34 allows rapid expansion of chip 4 when it is powered up, i.e. the wires must be able to traverse through gel 34 quite freely. Such gels, while essentially not compressible, are quite readily displaceable. Therefore, any movement of the gel inside chip receiving opening 14 must be prevented.

Preventing movement of gel 34 is opening 14 can be readily accomplished by completely filling opening 14 with gel 34. However, if the entire chip carrier 2 is to be encapsulated in a hard, monolithic structure of sand and binder, as was previously described, the expansion of gel 34 due to the rapid heating of chip 4 will cause extremely high pressure in opening 14. This pressure may be great enough to cause the chip carrier to fail.

Therefore, in order to prevent the occurrence of extreme pressures, a space must be provided which will allow the gel to expand. However, this space must be pressure biased in the direction of opening 14 is order to maintain a high enough pressure to prevent gel 34 from movement under shock conditions.

Consequently, accumulator 38 is provided on leading surface 37 of cap 36. This accumulator is configured to compress and expand as needed. In operation, accumulator 38 occupies a particular volume when chip 4 is not in operation, as is shown in FIG. 2. In this position gel 34 is prevented from movement in opening 14, as the entire volume of opening 14 is occupied. As chip 4 is place in use, the rapid heating of chip 4 causes gel 34 to expand. Accumulator is forced to compress to the position shown in FIG. 3. In this position gel 34 is still prevented from movement relative to chip 4, as the entire volume of opening 14 remains occupied. As chip 4 is cooled, gel 34 contracts and accumulator 38 expands to the original position shown in FIG. 2. This process is repeated each time chip 4 is required to heat up.

Accumulator 38 is configured to yield to the expansion of gel 34 as required. The action of accumulator 38 maintains a pressure sufficiently high, at all times, so that no lateral movement or slushing of gel 34 can occur, even when chip carrier 2 is exposed to significant outside forces. The consistency of gel 34 can be properly adjusted so that the gel will provide additional support to the bonded wires, such that the bonds and the wires can sustain the shock of exposure to large forces.

Changes in construction will occur to those skilled in the art and various apparently different modifications and embodiments may be made without departing from the scope of the invention. The matter set forth in the foregoing description and accompanying drawings is offered by way of illustration only. It is therefore intended that the foregoing description be regarded as illustrative rather than limiting.

I claim:

1. A chip carrier for use with an integrated circuit, the chip carrier having a first major surface and an oppositely facing second major surface, a chip receiving opening is provided in the chip carrier and extends from the first major surface toward the second major surface, side walls are provided about the chip receiving opening, the side walls extend from the first major surface to the second major surface, a gel is provided in the chip receiving opening, the gel surrounds a chip positioned in the chip receiving opening, a cap is positioned in the chip receiving opening proximate the first major surface, the cap cooperating with the side walls to retain the gel in the chip receiving opening, terminals are provided in the chip carrier and extend from the chip receiving opening through the side walls, the chip carrier being characterized in that:

accumulator means are provided in the chip receiving opening in engagement with both said cap and said gel so that substantially no space exists therebetween, the accumulator means having resilient characteristics which allows the accumulator means to compress when a force is applied thereto, and expand back to its original volume when the force is removed, wherein said accumulator means is attached to a first surface of the cap, such that as the cap is positioned in the chip receiving opening, the accumulator means engages the gel in the chip receiving opening so that as the gel is caused to expand in the chip receiving opening, the accumulator means is compressed, thereby preventing the gel from applying large forces to the side walls and the cap of the chip carrier, and as the gel contracts, the accumulator means expands to insure that pressure is maintained on the gel in order to prevent the unrestrained motion of the gel in the chip receiving opening.

2. A chip carrier as set forth in claim 1 further characterized in that the gel is essentially noncompressible, but readily displaceable, such that interconnection means of the chip are able to traverse through the gel with no adverse affects.

3. A chip carrier as set forth in claim 2 further characterized in that the interconnection means of the chip are fragile wires and wire bonds.

4. A chip carrier as set forth in claim 2 further characterized in that the interconnection means of the chip are comprised of a tape automated bonded lead structure.

* * * * *